United States Patent
Jeong

(10) Patent No.: US 6,380,784 B1
(45) Date of Patent: Apr. 30, 2002

(54) CIRCUIT FOR GENERATING SENSE AMPLIFIER CONTROL SIGNAL FOR SEMICONDUCTOR MEMORY

(75) Inventor: Young-Han Jeong, Choongcheongbuk-Do (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/599,614

(22) Filed: Jun. 23, 2000

(30) Foreign Application Priority Data

Sep. 7, 1999 (KR) .............................. 99-37831

(51) Int. Cl.[7] .............................................. H03H 11/26
(52) U.S. Cl. ........................................ 327/261; 327/269
(58) Field of Search ........................... 327/51, 57, 141, 327/161, 163, 261, 263, 264, 269, 284; 365/222, 194, 205, 207

(56) References Cited

U.S. PATENT DOCUMENTS

| | | | | |
|---|---|---|---|---|
| 4,578,782 A | * | 3/1986 | Kraft et al. ............... | 365/222 |
| 5,033,026 A | * | 7/1991 | Tsujimoto .................. | 365/222 |
| 6,104,656 A | * | 8/2000 | Jung ......................... | 365/207 |
| 6,141,279 A | * | 10/2000 | Hur et al. ................... | 365/222 |
| 6,166,977 A | * | 12/2000 | Saitoh et al. ............... | 365/205 |
| 6,208,577 B1 | * | 3/2001 | Mullarkey .................. | 365/222 |

\* cited by examiner

*Primary Examiner*—Matthew Smith
*Assistant Examiner*—Paul Dinh
(74) *Attorney, Agent, or Firm*—Fleshner & Kim, LLP

(57) ABSTRACT

A circuit is provided that generates a sense amplifier control signal for a semiconductor memory in which signal paths for a normal operation and a refresh operation are separately formed so that a pulse width of an overdriving interval in the refresh operation is reduced. The reduced overdriving interval in the refresh operation reduces a refresh current. The circuit for generating the sense amplifier control signal for a semiconductor memory circuit can include a first delay that delays a sense amplifier enable signal for a first delay time, a second delay that delays an output signal from the first delay for a second delay time and a logic unit that receives output signals from the first delay and from the second delay and operates in normal operations and refresh operations in accordance with a refresh control signal to perform a logic operation on the output signals of the first and second delays, so that the overdriving interval is set shorter for the refresh operation relative to the normal operation.

19 Claims, 3 Drawing Sheets

CIRCUIT FOR GENERATING SENSE AMPLIFIER CONTROL SIGNAL FOR SEMICONDUCTOR MEMORY

BACKGROUND OF THE INVENTION

1. Field of the Invention

The present invention relates to a semiconductor memory circuit, and more particularly, to a semiconductor memory circuit.

2. Background of the Related Art

In general, for rapid bit line sensing in a semiconductor memory device, an overdriving method is employed in which a sense amplifier is initially driven with a high voltage and then driven with a low voltage. FIG. 1 is a schematic view of a related art control circuit for generating a sense amplifier control signal in a semiconductor memory. The related art semiconductor memory includes a delay 10 for delaying a sense amplifier enable signal SAEBi to output it after a predetermined time, and a logic unit 20 for logically combining the sense amplifier enable signal SAEBi and the delay signal to generate a first and a second sense amplifier control signals SAP1B and SAP2B.

The logic unit 20 includes a first NOR gate NR1 for NORing the sense amplifier enable signal SAEBi and an output signal from the delay 10, a first and a second inverters INV1 and INV2 for buffering the sense amplifier enable signal SAEBi and a fourth and a fifth inverters INV4 and INV5 for buffering an output signal from the first NOR gate NR1. A second NOR gate NR2 NORs an output signal from the second and fifth inverters INV2 and INV5. A third inverter INV3 inverts an output signal from the second NOR gate NR2 and outputs the first sense amplifier control signal SAP1B, and a sixth or eighth inverters INV6–INV8 sequentially invert an output signal from the fifth inverter INV5 to output a second sense amplifier control signal SAP2B.

The operation of the related art circuit for generating a sense amplifier control signal will now be described with reference to FIG. 2. FIG. 2 shows signal waveforms at points of FIG. 1 in accordance with the related art.

First, when the sense amplifier enable signal SAEBi is activated with "low" level signal, the signal is outputted as a delay signal A1. The delay signal A1 is delayed for a predetermined time tD through the delay 10. The sense amplifier enable signal SAEBi and the delay signal A1 are NORed by the first NOR gate NR1 to output a signal B1.

The sense amplifier enable signal SAEBi is outputted as a buffered signal C1 after passing through the first and second inverters INV1 and INV2, and the signal B1 is outputted as a buffered signal D1 after passing through the fourth and fifth inverters INV4 and INV5. The output signals C1 and D1 of the seconded and fifth inverters INV2 and INV5 are NORed by the second NOR gate NR2 and inverted by the third inverter INV3, according to which a first sense amplifier control signal SAP1B is generated with a pulse width as long as the delay time tD of the delay 10. The pulse width tD of the first sense amplifier control signal SAP1B becomes an overdriving interval tD of the sense amplifier. Meanwhile, the output signal D1 of the fifth inverter INV5 passes through the sixth to eighth inverters INV6–INV8 to thereby generate the second sense amplifier control signal SAP2B.

Consequently, after the first sense amplifier control signal SAP1B is first activated to perform the overdriving for the predetermined time tD, the second sense amplifier control signal SAP2B is activated to control the sense amplifier when the first sense amplifier control signal SAP1B is disabled.

The first sense amplifier control signal SAP1B is outputted as a signal having a high level voltage through a level shifter and the second sense amplifier control signal SAP1B is outputted as a signal having a low level voltage. Therefore, to sense a bit line quickly, a bit line signal is amplified by using the first sense amplifier control signal SAP1B having the high level voltage, and then is amplified by using the second sense amplifier control signal SAP2B having a low level voltage.

As described above, the related art circuit for generating the sense amplifier control signal has various disadvantages. In the related art circuit for generating the sense amplifier control signal in the semiconductor memory, since the whole bank is simultaneously operated during the refresh operation, the current consumption is quite high at the overdriving interval that requires the high level voltage.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a circuit for sense amplifier control signal for a semiconductor memory that reduces a refresh current.

Another object of the present invention is to provide a circuit for sense amplifier control signal for a semiconductor memory in which signal paths for normal and refresh operation are different.

Another object of the present invention is to provide a circuit for sense amplifier control signal for a semiconductor memory that reduces a pulse width of an overdriving interval in refresh operations.

Another object of the present invention is to provide a circuit for sense amplifier control signal for a semiconductor memory in which signal paths for a normal operation and a refresh operation are separately formed so that a pulse width of an overdriving interval in the refresh operation is reduced and a refresh current is reduced.

To achieve at least these and other advantages in a whole or in parts and in accordance with the purpose of the present invention, as embodied and broadly described herein, there is provided a sense amplifier control circuit, including a first delay that delays a sense amplifier enable signal for a first prescribed delay time, a second delay that delays an output signal from the first delay for a second prescribed delay time, and a logic circuit that determines a normal operation and a refresh operation of the circuit and logically processes a refresh control signal, the output signal of the first delay and an output signal of the second delay so that different overdriving intervals are set for the normal operation and the refresh operation, respectively.

To further achieve at least these and other advantages in a whole or in parts and in accordance with the purpose of the present invention, as embodied and broadly described herein, there is provided a circuit, including a first delay that delays an enable signal for a first prescribed delay time, a second delay that delays an output signal from the first delay for a second prescribed delay time, and a logic circuit that determines a first mode and a second mode of the circuit and logically processes a control signal, the output signal of the first delay and an output signal of the second delay so that different overdriving intervals are set for the first mode and the second mode, respectively.

To further achieve at least these and other advantages in a whole or in parts and in accordance with the purpose of the present invention, as embodied and broadly described herein, there is provided a method of operating a circuit for generating a sense amplifier control signal for a semiconductor memory, including delaying a sense amplifier enable signal for a first prescribed delay time, delaying the sense amplifier enable signal for a second prescribed delay time that is longer than the first prescribed delay time, determining a normal operation and a refresh operation of the circuit, and generating a reduced overdriving interval signal for the refresh operation relative to a normal overdriving interval signal set for the normal operation by logically processing a refresh control signal and the delayed sense amplifier enable signals.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 3:
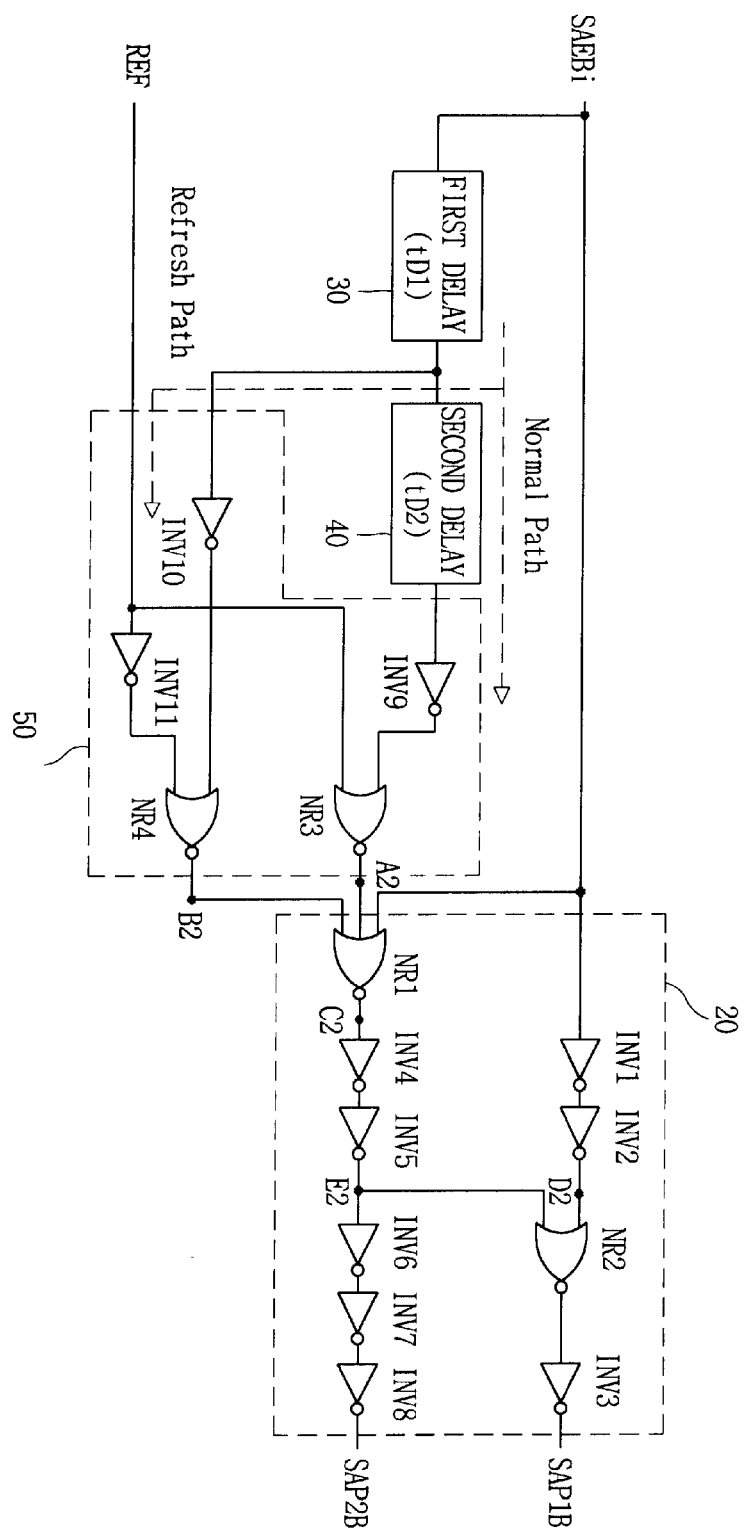
FIG. 3 is a schematic block diagram that shows a preferred embodiment of a circuit for generating a sense amplifier control signal for a semiconductor memory in accordance with the present invention.

FIG. 3 is a schematic block diagram that shows a preferred embodiment of a circuit that generates a sense amplifier control signal for a semiconductor memory in accordance with the present invention. The first preferred embodiment of the sense amplifier control circuit includes a first delay 30 for delaying a sense amplifier enable signal SAEBi prescribed first delay time tD1, a second delay 40 for delaying the first delay signal, which is output by the first delay 30, to output it after a prescribed second delay time tD2 and a first logic unit 50. The first logic unit 50 determines a normal operation and a refresh operation for delay signals from the first delay 30 or from the second delay 40 by performing a logic operation with a refresh control signal REF. A second logic unit 20 logically combines the sense amplifier enable signal SAEBi and the output signal from the first logic unit 50 to generate a first and a second sense amplifier control signals SAP1B and SAP2B.

Figure 1:
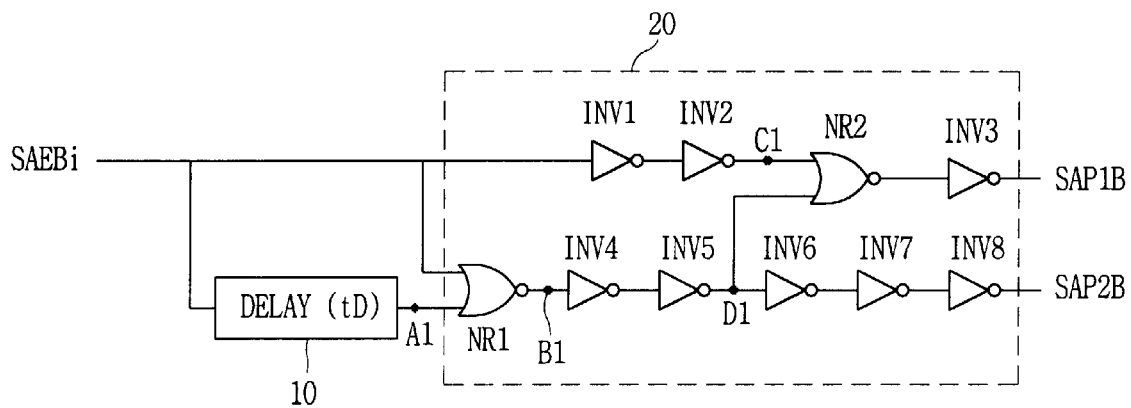
FIG. 1 is a schematic block diagram of a related art circuit for generating a sense amplifier control signal.
Figure 2:
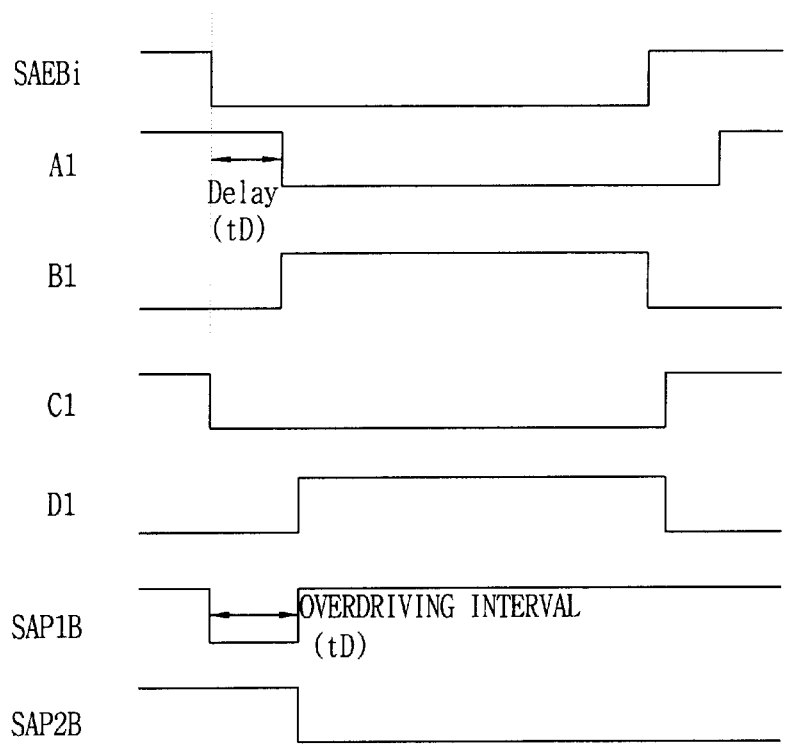
FIG. 2 is a diagram that shows signal waveforms at points of FIG. 1.

The second logic unit 20 has similar structure with same reference numerals as to the logic unit 20 of the related art circuit of FIG. 1. Thus, a detailed description is omitted.

The first logic unit 50 includes a ninth inverter INV9 for inverting the output signal received from the second delay 40, and a tenth inverter INV10 is for inverting the output signal received from the first delay 30. An eleventh inverter INV11 inverts the refresh control signal REF. A third NOR gate NR3 is for NORing the refresh control signal REF and an output signal from the ninth inverter INV9, and a fourth NOR gate NR4 is for NORing output signals respectively received from the tenth and the eleventh inverters INV10 and INV11.

Figure 4A:
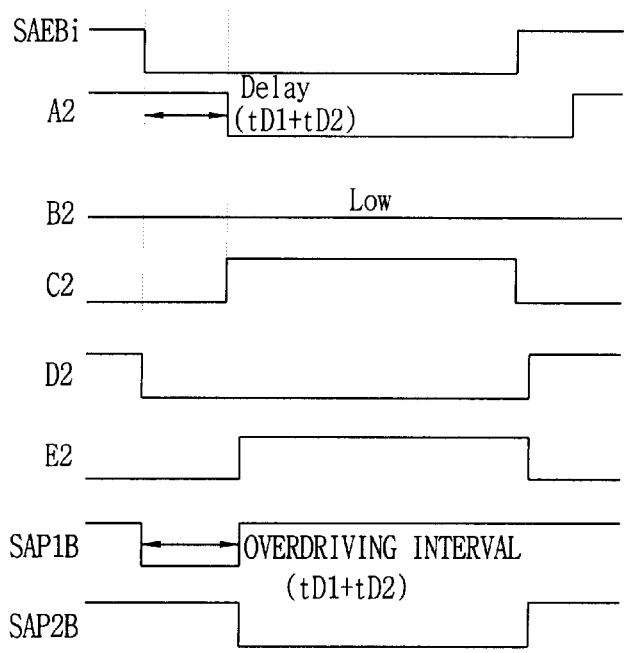
FIG. 4A is a diagram that shows signal output waveforms at points of FIG. 3 according to a normal operation path in accordance with the present invention.
Figure 4B:
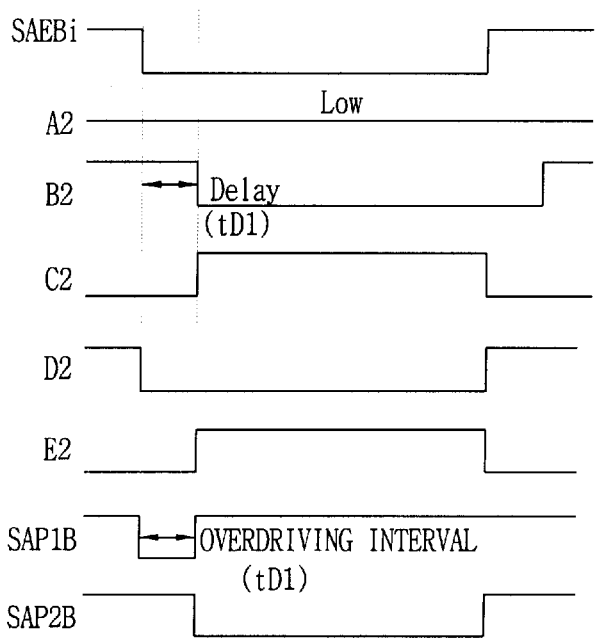
FIG. 4B is a diagram that shows signal output waveforms at points of FIG. 3 according to a refresh operation path in accordance with the present invention.

Operations of the first preferred embodiment of a circuit for generating a sense amplifier control signal for a semiconductor memory will not be described. FIGS. 4A and 4B respectively illustrate a normal operation and a refresh operation. FIG. 4A is a diagram that shows signal output timing waveforms at each labeled point of FIG. 3 according to normal operation path in accordance with first preferred embodiment of the present invention. FIG. 4B is a diagram that shows signal output timing waveforms at each labeled point of FIG. 3 according to a refresh operation path in accordance with first preferred embodiment of the present invention.

In normal operations, the refresh control signal REF has a low level, and a normal path is preferably formed as shown in a dotted line labeled "Normal Path" of FIG. 3. In the normal operation, the sense amplifier enable signal SAEBi is delayed as long as a time (tD1+tD2) by adding the delay time tD1 of the first delay 30 to the delay time tD2 of the second delay 40 having passed through the first and second delays 30 and 40. After being delayed, the sense amplifier enable signal SAEBi is then inverted by the ninth inverter INV9.

The inverter SAEBi signal and the low level refresh control signal REF are NORed by the third NOR gate NR3, so that the sense amplifier enable signal SAEBi is outputted as a signal A2 shown in FIG. 4A being delayed by the prescribed time (tD1+tD2).

Meanwhile, the low level refresh control signal REF is inverted by the eleventh inverter INV11 and the SAEBi signal delayed as long as the first delay time (tD1) by the first delay 30 is inverted by the tenth inverter INV10. The output signals from the tenth and eleventh inverters INV10 and INV11 are NORed by the fourth NOR gate NR4 and output a low level signal B2. The sense amplifier enable signal SAEBi and the output signals A2 and B2 from the third and fourth NOR gates NR3 and NR4 are NORed by the first NOR gate NR1 of the second logic unit 20 to output a signal C2.

The output signal C2 from the first NOR gate NR1 is sequentially inverted by the fourth and fifth inverters INV5 and INV5 and is input to the second NOR gate NR2. The sense amplifier enable signal SAEBi is sequentially inverted by the first and second inverters INV1 and INV2 and is input to the NOR gate NR2.

Accordingly, the output signals D2 and E2 from the second and fifth inverters INV2 and INV5, respectively, are NORed by the second NOR gate NR2. An output of the second NOR gate NR2 is inverted by the third inverter INV3, according to which the first sense amplifier control signal SAP1B is outputted. Thus, the pulse width (tD1+tD2) of the first sense amplifier control signal SAP1B is set by the second logic unit the same as the sense amplifier overdriving interval in the related art semiconductor circuit.

The output signal E2 from the fifth inverter INV5 is sequentially inverted by the sixth to eighth inverters INV6–INV8. Thus, the second sense amplifier control signal SAP2B is outputted.

Consequently, the first sense amplifier control signal SAP1B is activated to perform an overdriving for the prescribed time (tD1+tD2). Subsequently, when the first sense amplifier control signal SAP1B is disabled, the second sense amplifier control signal SAP2B is activated to control the sense amplifier.

Operations of the first preferred embodiment of the circuit in the refresh operation will now be described with reference to FIG. 4B. In refresh operations, the refresh control signal REF is activated with high level, to form a refresh path as illustrated by the dotted line labeled "Refresh Path" as shown in FIG. 3.

As shown in FIG. 4B, the output signal A2 from the third NOR gate has a low level. Further, the output signal B2 from the fourth NOR gate NR4 is outputted as a signal being equal to the sense amplifier enable signal SAEBi delayed as long as the delay time tD1 of the first delay 30.

The sense amplifier enable signal SAEBi and the output signals A2 and B2 from the third and fourth NOR gates NR3 and NR4 are NORed by the first NOR gate NR1 to output the signal C2. The output signal C2 from the first NOR gate NR1 is sequentially inverted by the fourth and fifth inverters INV4 and INV5 and applied or input to the second NOR gate NR2. The sense amplifier enable signal SAEBi is sequentially inverted by the first and second inverters INV1 and INV2 and input to the second NOR gate NR2.

Accordingly, the output signals D2 and E2 from the second and fifth inverters INV2 and INV5, respectively, are NORed by the second NOR gate NR2. The output of the second NOR gate NR2 is inverted by the third inverter INV3, according to which the first sense amplifier control signal SAP1B is generated having a pulse width equal to the delay time tD1 of the first delay 30, as shown in FIG. 4B. Concurrently, the output signal E2 from the fifth inverter INV5 is sequentially inverted by the sixth through eighth inverters INV6–INV8. Thus, the second sense amplifier control signal SAP2B is generated.

According to the first preferred embodiment, the first sense amplifier control signal SAP1B is activated first to perform an overdriving for a prescribed time (tD1+tD2). A time point when the first sense amplifier control signal SAP1B is disabled, the second sense amplifier control signal SAP2B is activated to control the sense amplifier. Since the pulse width tD1 of the first sense amplifier control signal SAP1B in the refresh operations is shorter than the pulse width tD1+tD2 in the normal operations, the overdriving interval becomes significantly reduced.

As described above, a first preferred embodiment of a circuit that generates sense amplifier control originals has various advantages. According to the first preferred embodiment of the circuit for generating a sense amplifier control signal of the present invention, separate paths are respectively provided in a first mode and a second mode or a normal operation and a refresh operation. Accordingly, the overdriving interval requiring a high voltage for the refresh operation is reduced, and thus, the current consumption can be significantly reduced.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A sense amplifier control circuit, comprising:
    a first delay that delays a sense amplifier enable signal for a first prescribed delay time;
    a second delay that delays an output signal from the first delay to delay the sense enable signal for a second prescribed delay time; and
    logic circuit means for determining a first operation and a refresh operation of the circuit and logically processes a refresh control signal, the output signal of the first delay and an output signal of the second delay to generate a sense amplifier control signal having an overdriving interval substantially equal to the first prescribed delay time and the second prescribed delay time in the first operation, and wherein the sense amplifier control signal is generated having the overdriving interval substantially equal to the first delay time in the refresh operation.

2. The circuit according to claim 1, wherein the first operation is a data sensing operation.

3. The circuit according to claim 1, wherein the logic circuit means outputs first and second sense amplifier control signals.

4. The circuit according to claim 3, wherein the first sense amplifier control signal is enabled to control a sense amplifier with a high level voltage for overdriving operations, and wherein the second sense amplifier control signal is enabled to control the sense amplifier with a low voltage when the first sense amplifier control signal is disabled.

5. The circuit according to claim 3, wherein the first sense amplifier control signal is an overdriving control signal that drives a shorter overdriving interval in the refresh operation.

6. The circuit according to claim 5, wherein the logic circuit means provides first and second signal paths for the first sense amplifier control signal in the first operation and the refresh operation, respectively.

7. The circuit according to claim 1, wherein the logic circuit means comprises:
    a first logic unit that receives the refresh control signal and the sense amplifier enable signal to output a first signal by delaying the sense amplifier enable signal for a time substantially equal to the first prescribed delay time added to the second prescribed delay time when the refresh control signal is in a first state, and wherein the first logic unit outputs a second signal by delaying the sense amplifier enable signal for the first prescribed delay time when the refresh control signal is in a second state; and
    a second logic unit that logically combines the first and second signals received from the first logic unit and the sense amplifier enable signal to generate a first sense amplifier control signal.

8. The circuit according to claim 7, wherein the first logic unit comprises:
    a first logic gate that logically processes the output signal from the second delay;
    a second logic gate that logically processes the output signal from the first delay;
    a third logic gate that logically processes the refresh control signal;
    a fourth logic gate that logically processes the refresh control signal and an output signal from the first logic gate to output the first signal; and
    a fifth logic gate that logically processes output signals from the second and the third logic gates to output the second signal.

9. The circuit according to claim 8, wherein the first through third logic gates are inverters, and wherein the fourth and fifth logic gates are NOR gates.

10. The circuit according to claim 8, wherein the second logic unit comprises:
  a first NOR gate that NORs the sense amplifier enable signal and the first and second signals;
  first and second inverters that sequentially invert the sense amplifier enable signal;
  third and fourth inverters that sequentially invert an output signal from the first NOR gate;
  a second NOR gate that NORs output signals from the second and the fourth inverters;
  a fifth inverter that inverts an output signal from the second NOR gate to output a first sense amplifier control signal; and
  sixth through eighth inverters that sequentially invert the output signal from the fourth inverter to output a second sense amplifier control signal.

11. The circuit according to claim 7, wherein the second logic unit comprises:
  a first logic gate that logically processes the sense amplifier enable signal, the first signal and the second signal;
  a first logic circuit that logically processes the sense amplifier enable signal;
  a second logic circuit that logically processes an output signal from the first logic gate;
  a second logic gate that logically processes output signals from the first and second logic circuits;
  a third logic gate that logically processes an output signal from the second logic gate to output a first sense amplifier control signal; and
  a third logic circuit that logically processes the output signal of the second logic circuit to output a second sense amplifier control signal.

12. A circuit, comprising:
  a first delay that delays an enable signal for a first prescribed delay time;
  a second delay that delays an output signal from the first delay for a second prescribed delay time; and
  a logic circuit that determines a first mode and a second mode of the circuit and logically processes a control signal, the output signal of the first delay and an output signal of the second delay so that different overdriving intervals are set for the first mode and the second mode, respectively, wherein the logic circuit comprises,
    a first logic unit that receives the control signal and the enable signal to output a first signal by delaying the enable signal for a time substantially equal to the first prescribed delay time added to the second prescribed delay time when the control signal is in the first state, and wherein the first logic unit outputs a second signal that delays the enable signal for the first prescribed delay time when the control signal is in a second state, and
    a second logic unit that logically combines the first and second signals received from the first logic unit and the enable signal to generate a first sense amplifier control signal.

13. The circuit according to claim 12, wherein a sense amplifier control signal is generated so that the overdriving interval is substantially equal to the first prescribed delay time added to the second prescribed delay time in the first mode, and wherein the sense amplifier control signal is generated so that the overdriving interval is substantially equal to the first delay time in the second mode.

14. The circuit according to claim 12, wherein the second logic unit further generates an additional sense amplifier control signal.

15. The circuit according to claim 14, wherein the first logic unit comprises:
  a first logic gate that logically processes the output signal from the second delay;
  a second logic gate that logically processes the output signal from the first delay;
  a third logic gate that logically processes the refresh control signal;
  a fourth logic gate that logically processes the refresh control signal and an output signal from the first logic gate to output the first signal; and
  a fifth logic gate that logically processes output signals from the second and the third logic gates to output the second signal.

16. The circuit according to claim 15, wherein the first mode is a data sensing operation mode and the second mode is a refresh operation mode, wherein the enable signal is a sense amplifier enable signal and the control signal is a refresh control signal, wherein the second logic unit outputs a second sense amplifier control signal, wherein the first through third logic gates are inverters, and wherein the fourth and fifth logic gates are NOR gates.

17. A method of operating a circuit for generating a sense amplifier control signal for a semiconductor memory, comprising:
  delaying a sense amplifier enable signal for a first prescribed delay time;
  receiving the delayed sense amplifier enable signal and delaying the sense amplifier enable signal for a second prescribed delay time that is longer than the first prescribed delay time;
  determining a data sensing operation and a refresh operation of the circuit using a logic circuit; and
  generating the sense amplifier control signal having an overdriving interval using the logic circuit, wherein the overdriving interval in the sense amplifier control signal for the refresh operation is substantially equal to the first prescribed delay time and shorter than the overdriving interval for the data sensing operation, wherein the sense amplifier control signal is generated by the logic circuit logically processing a refresh control signal, the sense amplifier enable signal and the delayed sense amplifier enable signals.

18. The method of claim 17, wherein the sense amplifier control signal is generated so that the overdriving interval is substantially equal to the first prescribed delay time and the second prescribed delay time in the data sensing operation.

19. The method of claim 18, further comprising outputting a second sense amplifier control signal by the logic circuit.

* * * * *